United States Patent [19]
Duane

[11] Patent Number: 6,091,118
[45] Date of Patent: Jul. 18, 2000

[54] SEMICONDUCTOR DEVICE HAVING REDUCED OVERLAP CAPACITANCE AND METHOD OF MANUFACTURE THEREOF

[75] Inventor: Michael Duane, Austin, Tex.

[73] Assignee: Advanced Micro Devices, Inc., Sunnyvale, Calif.

[21] Appl. No.: 09/103,699

[22] Filed: Jun. 24, 1998

Related U.S. Application Data

[62] Division of application No. 08/780,615, Jan. 8, 1997, Pat. No. 5,804,496.

[51] Int. Cl.$^7$ .......................... H01L 29/76; H01L 29/94; H01L 31/062; H01L 31/113; H01L 31/119
[52] U.S. Cl. .......................... 257/386; 257/364; 257/401
[58] Field of Search .................... 257/364, 386, 257/401

[56] References Cited

U.S. PATENT DOCUMENTS

| | | |
|---|---|---|
| 4,682,407 | 7/1987 | Wilson et al. . |
| 4,714,519 | 12/1987 | Pfiester et al. . |
| 4,745,079 | 5/1988 | Pfiester . |
| 4,894,689 | 1/1990 | Cooper, Jr. et al. . |
| 5,031,008 | 7/1991 | Yoshida . |
| 5,360,751 | 11/1994 | Lee . |
| 5,438,007 | 8/1995 | Vinal et al. . |
| 5,514,902 | 5/1996 | Kawasaki et al. . |
| 5,516,707 | 5/1996 | Loh et al. . |
| 5,554,871 | 9/1996 | Yamashita et al. . |
| 5,750,435 | 5/1998 | Pan . |
| 5,804,496 | 9/1998 | Duane . |
| 5,837,585 | 11/1998 | Wu et al. . |
| 5,844,272 | 12/1998 | Soderbarg et al. ............ 257/328 |
| 5,998,842 | 12/1999 | Sano ............................. 257/366 |

FOREIGN PATENT DOCUMENTS 3-198349  8/1991  Japan .

*Primary Examiner*—Ngân V. Ngô
*Attorney, Agent, or Firm*—Crawford PLLC

[57] ABSTRACT

A semiconductor device and process for manufacture thereof is disclosed in which a gate electrode with reduced overlap capacitance is formed by forming a gate electrode on a surface of a semiconductor and doping edge portions of the gate electrode with a first doping which effectively reduces the conductivity of the edge portions of the gate electrode. The conductivity of the gate electrode may be reduced at the edge portions by doping the edge portions with a dopant which inhibits the doping of the gate electrode or with a dopant which has a different conductivity type than the gate electrode dopant.

8 Claims, 4 Drawing Sheets

SEMICONDUCTOR DEVICE HAVING REDUCED OVERLAP CAPACITANCE AND METHOD OF MANUFACTURE THEREOF

This application is a Divisional of application Ser. No. 08/780,615, filed Jan. 8, 1997, and issued as U.S. Pat. No. 5,804,496 on Sep. 8, 1998 now U.S. Pat. No. 5,804,496.

FIELD OF THE INVENTION

The present invention is directed generally to a semiconductor device and method of manufacture thereof, and more particularly to such a device having reduced overlap capacitance.

BACKGROUND OF THE INVENTION

Over the last few decades, the electronics industry has undergone a revolution by the use of semiconductor technology to fabricate small, highly integrated electronic devices. The most common and important semiconductor technology presently used is silicon-based. A large variety of semiconductor devices have been manufactured having various applications in numerous disciplines. One such silicon-based semiconductor device is a metal-oxide-semiconductor (MOS) transistor.

The principal elements of a typical MOS semiconductor device are illustrated in FIG. 1. The device generally includes a semiconductor substrate 101 on which a gate electrode 103 is disposed. The gate electrode 103 is typically a heavily doped conductor having uniform conductivity. An input signal is typically applied to the gate electrode 103 via a gate terminal (not shown). Heavily doped source/drain regions 105 are formed in the semiconductor substrate 101 and are connected to source/drain terminals (not shown). As illustrated in FIG. 1, the typical MOS transistor is symmetrical, which means that the source and drain are interchangeable. Whether a region acts as a source or drain depends on the respective applied voltages and the type of device being made (e.g., PMOS, NMOS, etc.). Thus, as used herein, the term source/drain region refers generally to an active region used for the formation of a source or drain. A channel region 107 is formed in the semiconductor substrate 101 beneath the gate electrode 103 and separates the source/drain regions 105. The channel is typically lightly doped with a dopant type opposite to that of the source/drain regions 105. The gate electrode 103 is generally separated from the semiconductor substrate 101 by an insulating layer 109, typically an oxide layer such as $SiO_2$. The insulating layer 109 is provided to prevent current from flowing between the gate electrode 103 and the source/drain regions 105 or channel region 107.

In operation, an output voltage is typically developed between the source and drain terminals. When an input voltage is applied to the gate electrode 103, a transverse electric field is set up in the channel region 107. By varying the transverse electric field, it is possible to modulate the conductance of the channel region 107 between the source region and the drain region. In this manner an electric field controls the current flow through the channel region 107. This type of device is commonly referred to as a MOS field-effect-transistor (MOSFET).

The voltage potentials of an operative transistor create a number of capacitive loads which adversely effect transistor performance. Among the capacitance developed in the above-described type of transistor is the overlap capacitance formed between the gate electrode 103 and an adjacent source/drain region 105. The overlap capacitance is a function of the extent of overlap between the gate electrode 103 and the underlying source/drain region 105 as well as a function of the thickness of the gate oxide layer 109. The overlap capacitance contributes to noise and tends to slow the switching speed of the transistor, both of which are undesirable from a performance standpoint.

SUMMARY OF THE INVENTION

Generally, the present invention relates to a semiconductor device having reduced overlap capacitance and a method of fabrication thereof. In accordance with one embodiment of the invention, the fabrication process for a semiconductor device includes: forming a gate electrode on a substrate of the semiconductor device; doping edge portions of the gate electrode with a first dopant; and doping the gate electrode with a second dopant different than the first dopant, wherein conductivity of the gate electrode is reduced at the edge portions which are doped with the first dopant. In accordance with one aspect of the invention, the width of the edge portions of the gate electrode, doped with the first dopant, has a length approximately equivalent to the overlap between the gate electrode and an adjacent active region. In accorance with one embodiment of the invention, the second dopant may be implanted prior to the first dopant.

In accordance with another particular embodiment of the invention, the edge portions of the gate electrode are doped with the first dopant by implanting the first dopant into the edge portions at an angle between 0° C. and 90° C. with respect to the substrate surface. The first dopant may be implanted into the edges portions without substantial penetration into the adjacent active region. Alternatively the first dopant may be implanted into the adjacent active region to impede lateral diffusion of an active region dopant.

The above summary of the present invention is not intended to describe each illustrated embodiment or every implementation of the present invention. The figures and the detailed description which follow more particularly exemplify these embodiments.

BRIEF DESCRIPTION OF THE DRAWINGS

The invention may be more completely understood in consideration of the following detailed description of various embodiments of the invention in connection with the accompanying drawings, in which.

Figure 1:
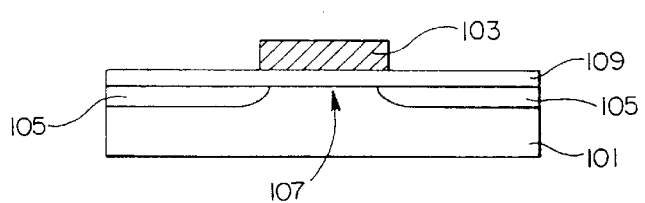
FIG. 1 illustrates one typical MOS semiconductor device structure.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION OF THE VARIOUS EMBODIMENTS

The present invention is believed to be applicable to a number of semiconductor devices, including in particular MOS structures. While the present invention is not so limited, an appreciation of various aspects of the invention will be gained through a discussion of the fabrication process and characteristics of such a device in connection with the examples provided below.

Figure 2A:
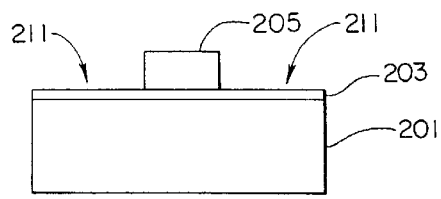
FIGS. 2A–2F illustrate a fabrication process in accordance with one embodiment of the invention.

FIGS. 2A–2F illustrate a process for fabricating a lightly-doped-drain (LDD) semiconductor device having a gate electrode with reduced overlap capacitance. Using known techniques, an oxide layer 203 is formed on a substrate 201. Gate electrodes 205 (only one of which is shown) are then formed on the oxide layer 203. The resultant structure is illustrated in FIG. 2A. It will be appreciated that a number of different known fabrication techniques could be used to obtain the gate electrode structure depicted in FIG. 2A.

Figure 2B:
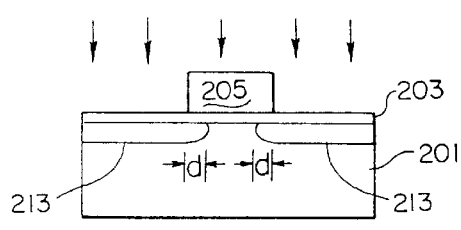

A portion of the semiconductor substrate 201 which lies adjacent the gate electrode 205 generally defines an active region 211 of the substrate 201. As used herein, the term active region encompasses a region where an active portion of the semiconductor device has been or will be formed. The active region 211 may serve, for example, as a source/drain region of a semiconductor device. To form an LDD source/drain region, the active region 211 is lightly doped, for example, by implantation, using the gate electrode 205 to align the implantation. In this manner an LDD region 213 is formed in the substrate 201 as illustrated in FIG. 2B. The LDD region 213 extends beneath the gate electrode 205 by a distance d, a primary factor in the overlap capacitance of conventional semiconductors.

Figure 2C:
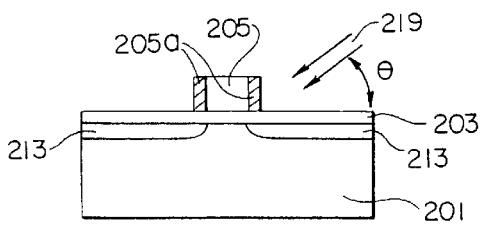

Edge portions 205a of the gate electrode 205 are doped with a dopant (edge dopant) used to reduce the conductivity of the edge portions 205a of the gate electrode 205 relative to the other regions of the gate electrode 205 as more fully described below. The term dopant as used herein generally includes any type of impurity, whether electrically active or inactive, which is added to a material to alter its properties in the described manner. The structure resulting from the edge doping is shown in FIG. 2C. As will be discussed below, the gate electrode is typically heavily doped with a gate dopant to form a conductor. In one embodiment, the edge dopant varies the conductivity of the gate electrode 205 by inhibiting active diffusion of the gate dopant at the edge portions 205a. In an alternative embodiment, the edge dopant has a conductivity type opposite that of the gate dopant thereby reducing the conductivity of the edge portions 205a. The energies and dopant dosages used to dope the edge portions 205a are selected to provide sufficient lateral penetration of the edge dopant into the gate electrode to reduce the overlap capacitance of the semiconductor device.

In one embodiment, the edge dopant is implanted into the edges 205a of the gate electrode 205 at an angle θ with respect to the surface of the substrate as exemplified by the arrows 219 of FIG. 2C. This may be accomplished in a single implantation process by rotating the substrate 201 or in a multi-step implantation process if desired. Though the illustrative embodiment utilizes implantation, it should be appreciated that other doping processes, such as deposition, fall within the scope of the invention. The angle θ is has a magnitude sufficient to allow the edge dopant to penetrate into the edge portions without substantial penetration into the inner region of the gate electrode. The magnitude of angle θ is also typically sufficient to allow implantation of the edge dopant into successive gate electrodes on the substrate while still allowing penetration of the edge dopant into the edge portions of a given gate electrode. The angle θ generally lies between 0° C. and 90° C. and is about 45° C. in the illustrated embodiment. What is important is that the particular angle, energy level, and dopant dosage is selected to reduce overlap capacitance.

Figure 2D:
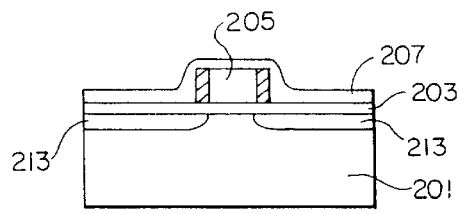
Figure 2E:
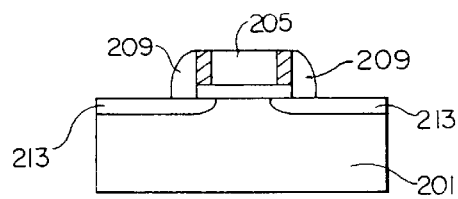
Figure 2F:
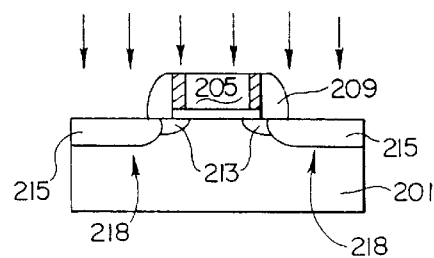

Using conventional techniques, a spacer layer 207, typically an oxide layer, is formed, followed by the formation of spacers 209 on sidewalls of the gate electrode 205, as illustrated in FIGS. 2D and 2E. The gate dopant is then implanted into the electrode gate 205 and, using the spacers 209 for alignment, dopants are implanted into the exposed portions of the substrate to form a heavily-doped region 215, of an LDD source/drain region 218, in the substrate 201. Doping of the gate electrode 205 and the heavily-doped source/drain region 215 typically occurs at the same time using the same dopant, as illustrated by the arrows of FIG. 2F. It should be appreciated however that this gate and source/drain implant can be performed in separate steps and/or with different dopants.

The above process can be used to form an LDD semiconductor device having a gate electrode with reduced overlap capacitance, basic components of which are depicted in the structure of FIG. 2F. In particular, the gate electrode 205 has a highly-doped and highly conductive inner region (used to set up a transverse electric field in the channel region) and lower conductance edge portions 205a provided to reduce overlap capacitance. In one aspect, the above process intentionally creates a depletion layer, at the edge of the gate electrode, which conceptually forms an additional capacitance, in series with the overlap capacitance, thus reducing the overall overlap capacitance of the device.

The edge portions 205a may have a width substantially equivalent to the overlap between the gate electrode 205 and adjacent active region 211 as illustrated in FIG. 2F. In other embodiments, reduced conductivity edge portion widths may be greater to or less than the overlap as dictated by field effect design constraints. In this manner, the present invention reduces the overlap capacitance and increases the performance of the semiconductor, without significantly impacting the field effect in the channel region.

As mentioned above, two types of edge dopants may be used to reduce the conductance of the edge portions: an edge dopant that inhibits diffusion of the gate dopant or one which has a different conductivity type than the gate dopant and thus neutralizes the gate dopant. Edge dopants which inhibit the diffusion of the gate dopant reduce the concentration of the active gate dopant and effectively reduce the conductivity of the gate electrode at its edge portions 205a. The particular type of inhibiting dopant will depend on the type of transistor, NMOS, PMOS, etc. In an NMOS or PMOS transistor, for example, an electrically inactive dopant may be implanted into the edge portions 205a of the gate electrode at an energy level and concentration level suitable to attain the desired conductivity properties and width of the doped edge portions. For example, a nitrogen containing species such as $N_2$ may be implanted at approximately 50 keV and a concentration of 1E14 to 1E16 atoms/$cm^2$.

Edge dopants which have a conductivity type opposite to that of the gate dopant also reduce the conductivity of the gate electrode 205 at its edge portions 205a by neutralizing or counteracting, at least to some degree, the gate dopant. Again the particular type of dopant will depend on the type of transistor. For example, in an NMOS transistor, a p-type dopant, such as Boron, may be used, whereas in a PMOS circuit, an n-type dopant, such as arsenic, may be used.

The edge dopant may implanted into the edge portions 205a of the gate electrode 205 without substantial penetration into the active regions 211 (used to form the source/ drain region 218). For example, the edge dopant may be implanted at energy levels where no edge dopant penetrates into the active region 211 or where the amount of edge dopant in the active region 211 does not adversely affect the formation of and eventual conductive properties of the source/drain region 218. In either event, some or all of the edge dopant may be captured in the oxide layer 203 above the active region 211 and removed during spacer formation. In further embodiments, the edge dopant is implanted such that it substantially penetrates into the active region 211. In this manner, the edge dopant is also used to impede lateral diffusion into the channel region of dopants used to form the lightly-doped and/or heavily doped regions 213 and 215 of the source/drain region 218. By impeding lateral diffusion of these dopants, overlap capacitance can be further reduced.

It will be appreciated that the above described process is not limited to the formation of LDD devices, but may be used to form a number of different semiconductor devices. For example, the LDD implant illustrated in FIG. 2B may be omitted with the source/drain region being formed solely by the heavy doping illustrated in FIG. 2F. Moreover, though FIGS. 2A–2F illustrate the edge portions of the gate electrode being doped with the edge dopant prior to the gate electrode being doped with the gate dopant, in other embodiments this order is reversed and the edge dopant is introduced after the gate electrode has been doped with the gate dopant.

Figure 3A:
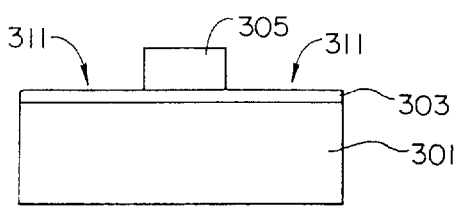
FIGS. 3A–3F illustrate another fabrication process in accordance with another embodiment of the invention.
Figure 3B:
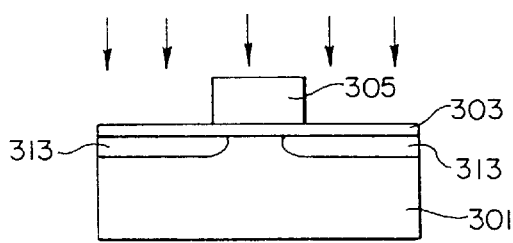

FIGS. 3A–3F illustrate another particular embodiment of the invention where the doping of the edge portions 305a of a gate electrode 305 is performed through a spacer layer 307. As illustrated in FIGS. 3A and 3B, the gate electrode 305 is disposed on a gate oxide layer 303 and used to align an LDD implantation process to form an LDD region 313 in the substrate 301.

Figure 3C:
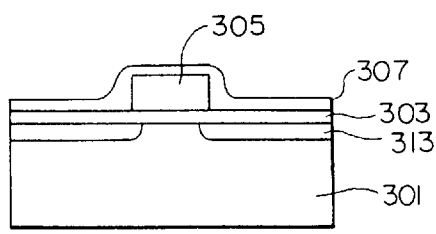
Figure 3D:
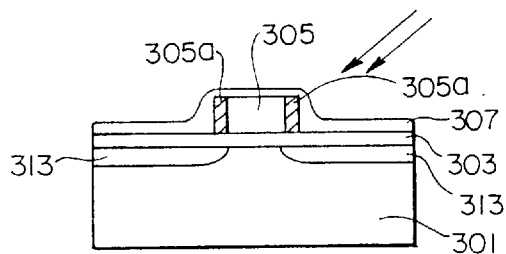
Figure 3E:
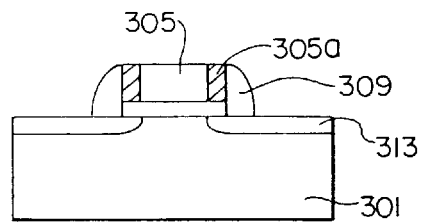
Figure 3F:
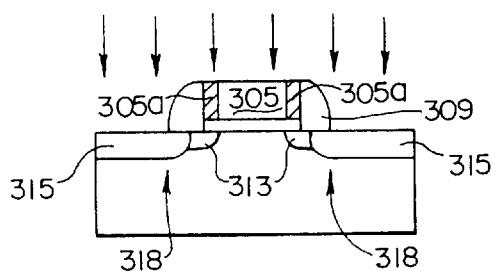

A spacer layer 307, typically an oxide layer such as $SiO_2$, is formed over the resultant structure and an edge dopant is implanted through the spacer layer 307 into edge portions 305a of the gate electrode 305, as illustrated in FIGS. 3C and 3D. Implantation through a spacer layer allows for higher energy levels and more controllable implantation of the edge dopant. Spacers 309 are then formed using conventional techniques and a conventional source/drain implant is carried out to dope the gate electrode and form a heavily-doped region 315 of a source/drain region 318, as illustrated in FIG. 3F.

Figure 4A:
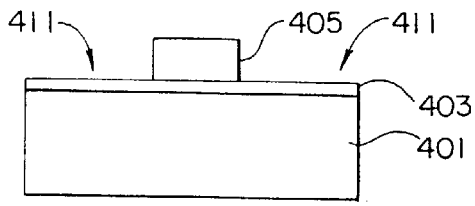
FIGS. 4A–4F illustrate another fabrication process in accordance with another embodiment of the invention.
Figure 4B:
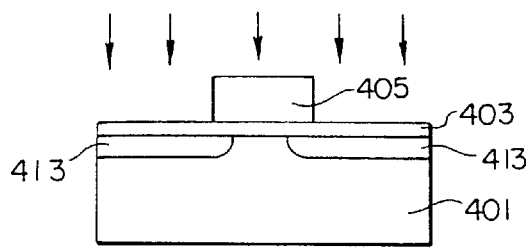
Figure 4C:
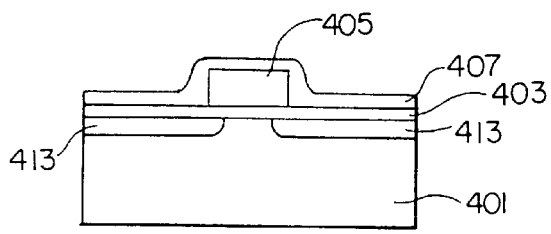
Figure 4D:
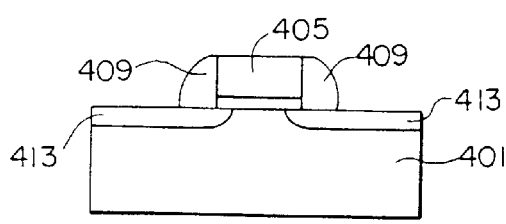
Figure 4E:
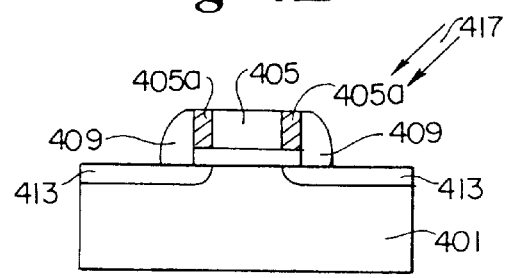
Figure 4F:
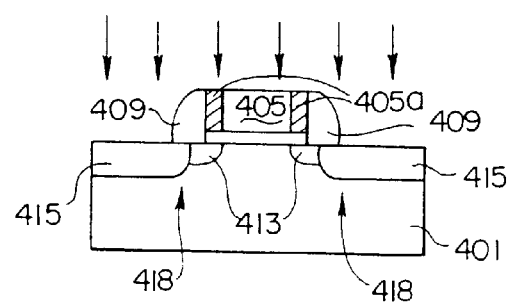

FIGS. 4A–4F illustrate another embodiment of the invention which includes doping edge portions of a gate electrode through a spacer. In a similar manner as discussed above, the gate electrode 405 is disposed on a gate oxide layer 403 and used to align an LDD implantation process to form an LDD region 413 in the substrate 401, as illustrated in FIGS. 4A and 4B. A spacer layer 407 is formed over the resultant structure and spacers 409 are formed using conventional techniques, as illustrated in FIG. 4C and 4D. An edge dopant is implanted through the spacer 409 into edge portions 405a of the gate electrode 405, as illustrated by the arrows 417 in FIG. 4E. Implantation of the edge dopant is followed by a conventional source/drain implant to dope the gate electrode and form the heavily-doped region 415 of an LDD source/drain 418, as illustrated in FIG. 4F. Implantation through a spacer finds advantages in certain applications by allowing implantation of the edge dopant at higher energy levels. Moreover, by implanting through a spacer rather than a spacer layer, higher penetration of the active region with the edge dopant can be achieved, thereby reducing the lateral diffusion of the source/drain implants.

Figure 5A:
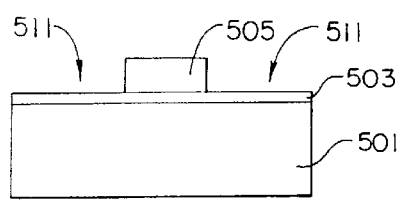
FIGS. 5A–5F illustrates yet another fabrication process in accordance with another embodiment of the invention.
Figure 5E:
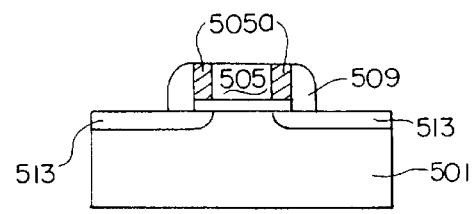
Figure 5B:
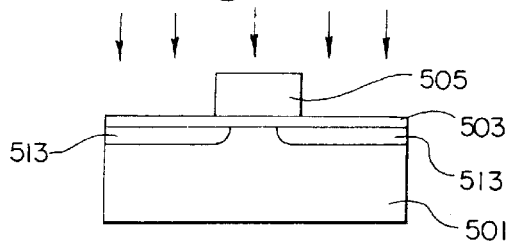

FIG. 5A–5F illustrate still another embodiment of this invention in which an insulating layer, such as an oxide layer is used for doping edge portions of a gate electrode. In a similar manner as discussed above, using known techniques, an oxide layer 503 is formed on a substrate 501 and a gate electrode layer 505 is formed on the oxide layer 503, as illustrated in FIG. 5A. An LDD region 513 may be formed using conventional techniques, as illustrated in FIG. 5B.

Figure 5F:
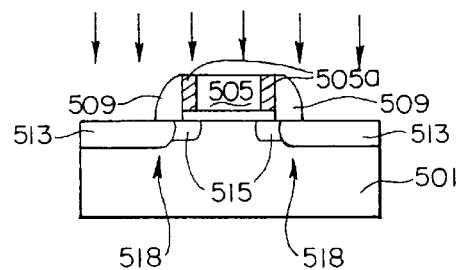
Figure 5C:
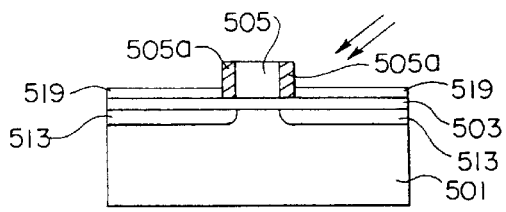
Figure 5D:
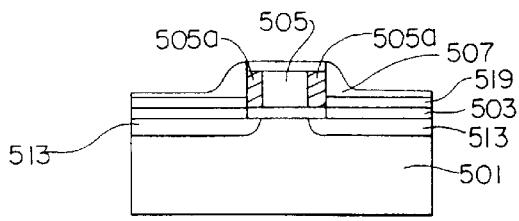

An additional insulating layer 519, such as $SiO_2$, is selectively formed over the active region 511, for example, by masking or deposition and etching, and an edge dopant is implanted into edge portions 505a of the gate electrode 505, as illustrated in FIG. 5C. A spacer layer 507 is formed over the resultant structure and spacers 509 are formed using conventional deposition and etching techniques, as illustrated in FIG. 5D and 5E. This is followed by a conventional source/drain implant to dope the gate electrode and form a heavily-doped region 513 of a source/drain region 518, as illustrated in FIG. 5F. This process allows the edge dopant to be implanted into the gate electrode edge portions 505a at higher energy levels without substantial penetration into the active region 211, thus providing more controllable implantation of the edge dopant into the edge portions 505a without substantially affecting implantation of the source/drain regions 518.

FIG. 5F is also illustrative of the basic components of an exemplary MOS structure which may be fabricated using various aspects of the processes described above. The structure includes a gate electrode 505 having reduced conductance edge portions 505a, source/drain regions 518 adjacent the gate electrode 505, and spacers 509 on the sidewalls of the gate electrode 505. The reduced conductance edge portions 505a have a lateral width comparable in length to the gate electrode-source/drain overlap. This improves transistor performance by reducing the capacitance between the gate electrode and the source/drain regions without significantly degrading the drive current of the transistor.

As noted above, the present invention is applicable to the fabrication of a number of different devices having reduced overlap capacitance. Accordingly, the present invention should not be considered limited to the particular examples described above, but rather should be understood to cover all aspects of the invention as fairly set out in the attached claims. Various modifications, equivalent processes, as well as numerous structures to which the present invention may be applicable will be readily apparent to those of skill in the art to which the present invention is directed upon review of the present specification. The claims are intended to cover such modifications and devices.

What is claimed is:

1. A semiconductor device, comprising:

a substrate; and a gate electrode disposed on the substrate, the gate electrode having at least one dopant and having edge portions and an inner region, the edge portions having a lower conductivity, and a lower concentration of the at least one dopant, than the inner region.

2. The semiconductor device of claim 1, further including an active region adjacent the gate electrode, wherein the edge portions of the gate electrode overlap a portion of the active region.

3. The semiconductor device of claim 1, wherein the edge portions further include a second dopant of a different conductivity type than the first dopant.

4. A semiconductor device, comprising:

a substrate; and a gate electrode disposed on the substrate, the gate electrode having a plurality of different dopants and having edge portions and an inner region, the edge portions having a lower conductivity, and a lower concentration of the dopants, than the inner region.

5. The semiconductor device of claim 4, further including an active region adjacent the gate electrode, wherein the edge portions of the gate electrode overlap a portion of the active region.

6. The semiconductor device of claim 4, wherein the gate electrode includes a first type of dopant, the edges portions having a lower concentration of the dopant, and a different type of dopant, than the inner region.

7. The semiconductor device of claim 4, wherein the edge portions further include a second dopant of a different conductivity type than the first dopant.

8. A semiconductor device, comprising:

a substrate, conductive means for gating, the conductive means, being disposed on the substrate, and having edge portions, an inner region, and first and second different dopants, and with the first dopant in the edge portions and the second dopant in the inner region, wherein the edge portions having a lower conductivity than the inner region.

* * * * *